United States Patent [19]
Sakai et al.

[11] Patent Number: 4,639,108
[45] Date of Patent: Jan. 27, 1987

[54] CODE PLATE

[75] Inventors: Shinji Sakai, Tokyo; Takashi Kawabata, Kanagawa; Yoshihito Harada, Tokyo, all of Japan

[73] Assignee: Canon Kabushiki Kaisha, Tokyo, Japan

[21] Appl. No.: 527,284

[22] Filed: Aug. 29, 1983

[30] Foreign Application Priority Data

Aug. 31, 1982 [JP] Japan .................................. 57-150088

[51] Int. Cl.⁴ .......................... G03B 3/10; G01D 5/249
[52] U.S. Cl. .................................. 354/289.1; 354/400; 340/347 P; 250/231 SE
[58] Field of Search ................................. 354/400–409, 354/485, 145.1, 289.1, 289.11, 289.12, 235.1; 340/347 P, 357; 250/231 SE

[56] References Cited

U.S. PATENT DOCUMENTS

| | | | |
|---|---|---|---|
| Re. 29,276 | 6/1977 | Mitani et al. ........................ | 354/421 |
| 2,796,598 | 6/1957 | Cartwright ....................... | 340/347 P |
| 3,797,029 | 3/1974 | Sorimachi et al. ............... | 354/235.1 |
| 4,410,949 | 10/1983 | Huellinghurst et al. ..... | 340/347 P X |
| 4,422,065 | 12/1983 | Radomirov et al. ......... | 250/231 SE |
| 4,423,958 | 1/1984 | Schmitt ...................... | 250/231 SE X |
| 4,439,672 | 3/1984 | Salaman ........................ | 250/231 SE |
| 4,442,423 | 4/1984 | Urbanik .................... | 250/231 SE X |
| 4,445,110 | 4/1984 | Breslow .................... | 250/231 SE X |
| 4,465,928 | 8/1984 | Breslow ........................ | 250/231 SE |
| 4,504,832 | 3/1985 | Conte .............................. | 340/347 P |

FOREIGN PATENT DOCUMENTS 0163412 12/1981 Japan ............................... 340/347 P

OTHER PUBLICATIONS

IBM Technical Disclosure Bulletin, "Automatic Code Generator", T. L. Vinson, vol. 16, No. 9, Feb. 1974, pp. 3012–3013.

Primary Examiner—William B. Perkey
Attorney, Agent, or Firm—Toren, McGeady, Stanger, Goldberg & Kiel

[57] ABSTRACT

A code plate for a camera comprises parts arranged in various two-dimensional shapes highly suited for an automatic focus control system for a zoom lens.

4 Claims, 8 Drawing Figures

FIG.4

| X | | BITS AT X IN INVERSE ORDER | Y | |
|---|---|---|---|---|
| 0 | 0 0 0 0 | 0 | 4 ~ | 16 |
| 1 | 0 0 0 1 | 8 | 9 ~ | 16 |
| 2 | 0 0 1 0 | 4 | 5 ~ | 16 |
| 3 | 0 0 1 1 | 12 | 13 ~ | 16 |
| 4 | 0 1 0 0 | 2 | 4 ~ | 16 |
| 5 | 0 1 0 1 | 10 | 11 ~ | 16 |
| 6 | 0 1 1 0 | 6 | 7 ~ | 16 |
| 7 | 0 1 1 1 | 14 | 15 ~ | 16 |
| 8 | 1 0 0 0 | 1 | 4 ~ | 16 |
| 9 | 1 0 0 1 | 9 | 10 ~ | 16 |
| 10 | 1 0 1 0 | 5 | 6 ~ | 16 |
| 11 | 1 0 1 1 | 13 | 14 ~ | 16 |
| 12 | 1 1 0 0 | 3 | 4 ~ | 16 |
| 13 | 1 1 0 1 | 11 | 12 ~ | 16 |
| 14 | 1 1 1 0 | 7 | 8 ~ | 16 |
| 15 | 1 1 1 1 | 15 | 16 ~ | 16 |

've
CODE PLATE

BACKGROUND OF THE INVENTION

1. Field of the Invention

This invention relates to a code plate and, more particularly, to a code plate for a camera comprising parts arranged in various two-dimensional shapes which are highly suited for an automatic focus control system for a zoom lens.

2. Description of the Prior Art

In the conventional automatic focus control system of a camera, a code plate is disposed on the lens side with the code plate consisting of signal source elements of different kinds, such as conductive parts and non-conductive parts. These parts are alternately arranged in a given direction to form a continuous comb-like on-and-off pattern. The shifting extent of the lens is monitored by allowing a brush to slide over this on-and-off pattern in association with the shift of the lens. The on-and-off pattern elements are spaced to correspond to a prescribed shifting pitch of the focal plane of the lens. For example, when a distance measuring unit of the camera detects that the focal plane deviates 1 mm from the surface of film, a lens position shifting motor is driven to shift the lens to a position which is reached with a total of a predefined number (e.g. 20) of on-and-off signals produced from the code plate and the lens is thus set in an in-focus state at that position.

In the case of photographing with a zoom lens, the ratio of the lens position shifting extent to a focal plane shifting extent varies with the zooming ratio. When the zooming ratio is for a double magnification, for example, the focal plane shifting extent resulting from the same front lens shifting extent varies to provide a four-fold difference between the wide angle side and the tele-photo side of the lens. More specifically, if one on-and-off signal corresponds to a focal plane shifting extent of 50$\mu$ on the wide angle side of the lens, it comes to correspond to a focal plane shifting extent of 200$\mu$ on the tele-photo side of the same lens. Accordingly, with the above-stated conventional code plate employed, the spacing distance of the on-and-off pattern greatly deviates from the prescribed pitch of the focal plane shifting extent when the zooming ratio of the lens becomes large. In that event, a focusing action would be repeated over and over again or result in hunting.

Conceivable solutions of this problem include an arrangement to electrically frequency divide the on-and-off signal according to the zooming ratio. However, this arrangement involves difficulties in terms of signal processing and electrical connection between the lens and the camera body.

SUMMARY OF THE INVENTION

It is a first object of the present invention to provide an improvement on the code plate conventionally used for a zoom lens, the improvement being arranged to be capable of solving the problems heretofore encountered in making an automatic focusing type zoom lens.

It is a second object of the invention to provide a code plate wherein spacing distance between mutually adjacent signal source elements of the same kind is arranged to be variable according to other variables.

It is a third object of the invention to provide a code plate suited for use in apparatus disclosed in a copending U.S. patent application entitled "Apparatus for detecting Amount of a Member to be controlled" and claiming the priority based on Japanese Patent Application No. Sho 57-118232. According to the present invention, the code plate is arranged to produce signals of 50% duty ratio, and the signal shaping and counting can be conveniently performed without any problem even when the raising or falling edge is used under the on-state and under the off-state.

These and further objects and features of the invention will become apparent from the following detailed description of preferred embodiments thereof taken in conjunction with the accompanying drawings.

BRIEF DESCRIPTION OF THE DRAWINGS

FIG. 4 shows a table required for making the code plate shown in FIG. 3.

DETAILED DESCRIPTION OF PREFERRED EMBODIMENTS

Figure 1:
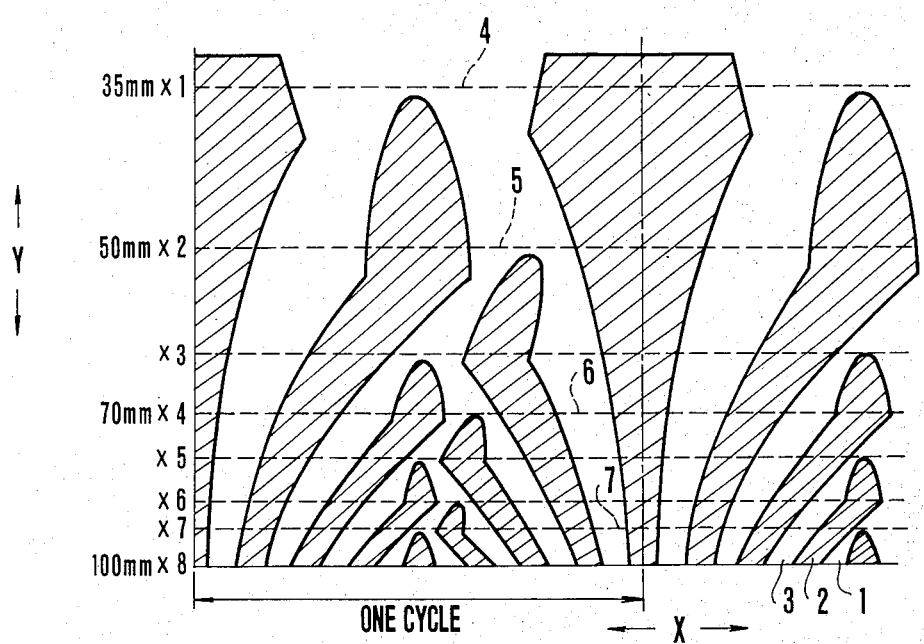
FIG. 1 shows a code plate as a first embodiment example of the invention.

Referring to FIG. 1 which shows a code plate as an embodiment of the invention, the code plate 1 comprises signal source elements consisting of conductive parts 2 and non-conductive parts 3. The code plate 1 is disposed on a distance ring.

A brush, which is not shown, is arranged to slide over the distance ring in response to the movement of a zoom lens. When a focusing operation causes the brush to move in the directions x, the brush comes into contact alternately with the conductive parts 2 and non-conductive parts 3. As a result, on-and-off signals are produced. Further, when the brush is caused by a zooming operation to move in the directions y, the pulse intervals of the above-stated on-and-off signals come to increase or decrease according as the focal length of the lens varies as a result of the zooming operation. Accordingly, the shifting extent of the zoom lens is monitored by the brush which slides over the two-dimensional arrangement of the code plate 1 having a zooming position in the direction y and a value reduced to a focal plane shifting extent in the direction x.

More specifically stated, the brush moves over a broken line 4 to produce one pulse per cycle when the focal length of the lens is 35 mm; over a broken line 5 to produce two pulses per cycle when the focal length is 50 mm; over a broken line 6 to produce four pulses per cycle when the focal length is 70 mm; and over another broken line 7 to produce eight pulses per cycle when the focal length is 100 mm. Meanwhile the moving extent of the brush for the same number of pulses becomes as follows: Assuming that the moving extent of the brush is 1 when the focal length is 35 mm, it becomes ½ when the focal length is 50 mm; ¼ when the focal length is 70; and ⅛ when the focal length is 100 mm. The moving extent of the brush thus becomes a value corresponding to the extent of focal plane shifting at each zooming position.

Accordingly, when the focal length of the lens is changed from 35 mm on the wide angle side to 70 mm on the tele-photo side, for example, the number of pulses per cycle increases from 1 to 4 while the moving extent of the brush is reduced to ¼. Therefore, extent of focal plane shifting which is increased by four times by a two-fold increase in the zooming ratio can be reduced to a ¼ value. This insures that the intervals of the on-and-off pattern never deviate from the given pitch and the extent of shifting never deviates from an in-focus range even when a focusing action is performed according to a number of pulses corresponding to the defocus extent existed at the time of the 35 mm focal length.

As described above, the code plate 1 is capable of giving a lens shifting extent monitor signal consisting of on-and-off signals of an unvarying pitch by virtue of reduction to the extent of focal plane shifting irrespectively of the zooming position. This enables a defocus extent detected by a distance measuring unit to be compared directly with the lens shifting extent monitor signal. The focusing action, therefore, always can be accomplished by one operation without repeating it and without the fear of hunting.

Figure 2:
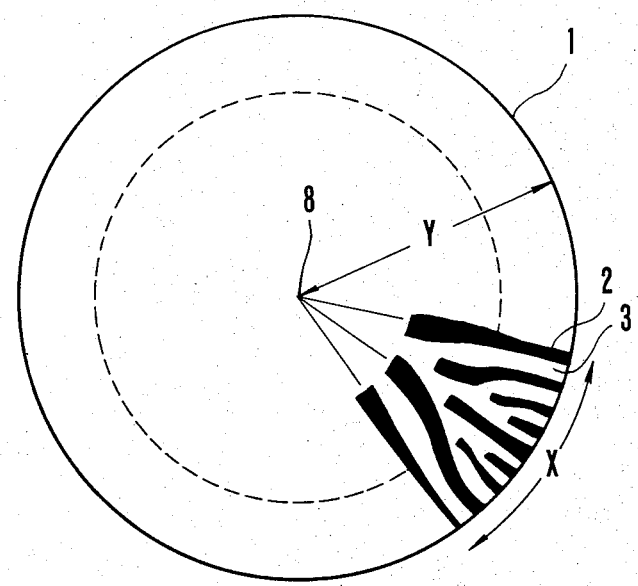
FIG. 2 shows a circular code plate as a second embodiment example.

FIG. 2 shows another embodiment of the invention. In this case, a circular code plate 1 comprises conductive parts 2 and non-conductive parts 3 which are arranged to have the number of pulses increase according as their positions come closer to the periphery of the circular plate. The code plate 1 is further provided with a rotating part which is arranged to be responsive to a focusing action on the lens.

The code plate 1 is arranged to be rotated on a shaft 8 by the focusing action. A brush, which is not shown, is arranged to be movable solely in the radial directions y. The brush produces on-and-off signals by coming in contact alternately with the conductive parts 2 and the non-conductive parts 3.

In the case where the lens is shifted by a zooming operation to a wide-angle position in order to have a short focal length, the above-stated brush is located at a point on the inner side of the code plate. The brush is arranged to move toward the outer side of the code plate according as the lens is shifted toward the telephoto side thereof and thus to come to have a longer focal length. The rotation angle x of the code plate 1 resulting from the same number of pulses is thus arranged to be reduced to the extent of focal plane shifting as the focal length increases. Therefore, a lens shifting extent monitor signal consisting of on-and-off signals of an unvarying pitch always can be obtained in response to selection of a zooming position. This enables a focusing action to be carried out by comparing the defocus extent directly with the shifting extent monitor signal in the same manner as in the preceding embodiment shown in FIG. 1.

Further, in accordance with the embodiment, examples shown in FIGS. 1 and 2, the conductive parts and the non-conductive parts are arranged to be of about the same width. Therefore, the duty ratio of the signal obtained from the code plate is 50%. These code plates, therefore, can be advantageously used for an apparatus for which the present applicants have previously filed Japanese Patent Application No. SHO 57-118232 under a title of "Apparatus for detecting Amount of a Member to be controlled."

Figure 3:
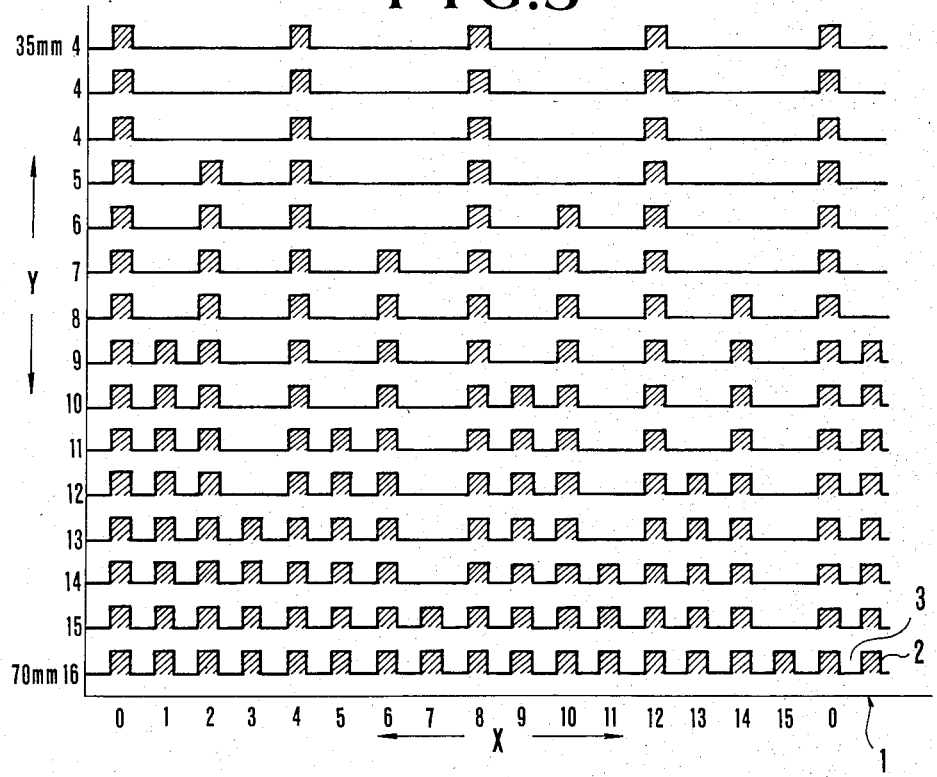
FIG. 3 shows a code plate as a third embodiment example, the example being arranged in a comb-like on-and-off pattern in which the positions of conductive parts 2 are fixed while the number of the conductive parts 2 is arranged to be variable.

FIG. 3 shows an example wherein the present invention is applied to a comb-like on-and-off pattern. In this case, the positions of the conductive parts 2 are predetermined and the number of the conductive parts 2 is arranged to be variable.

Like in the embodiment shown in FIG. 1, the brush is arranged to be shifted in the directions y by zooming operations. When the code plate 1 is moved in the directions x by focusing actions, on-and-off signals are produced by the contact of the brush alternately with the conductive parts 2 and the non-conductive parts 3 of the code plate 1 which are arranged in a comb-like shape.

A coordinate axis y indicates the number of comb teeth, or the number of pulses, per cycle obtained at each of zooming positions between focal lengths 35 mm and 70 mm. A coordinate axis x indicates the lens shifting extent. In one cycle in the direction x (i.e. x coordinates from 0 to 15), the number of comb teeth is 4 when the focal length is 35 mm. This number increases by 1 with each step of zooming and becomes 16 when the focal length becomes 70 mm. In addition to that, the comb teeth of the second of the x coordinates are arranged to increase by one at the y coordinate 5. Likewise, the comb teeth are also arranged to increase by one respectively for the 10th of x coordinates y—6, for the 6th of x at y—7, for the 14th of x at y—8, for the 1st of x at y—9, for the 9th of x at y—10, for the 5th of x at y—11, for the 13th of x at y—12, for the 3rd of x at y—13, for the 11th of x at y—14, for the 7th of x at y—15 and for the 15th of x at y—16. The arrangement is such that the number of pulses can be obtained at nearly unvarying intervals for each zooming step. Further, since the focal plane shifting extent does not much vary in the neighbourhood of focal length 35 mm, four comb teeth are arranged for each of 0–4 of the coordinates y.

FIG. 4 shows a table required for preparation of the code plate 1 shown in FIG. 3. The values of coordinates x of FIG. 3 are replaced with values arranged by inversely reading their 4 bit binary values as shown in FIG. 4. A difference between each of these values and 16 which represents the largest value of the coordinates y is considered to be the number of the comb teeth of a corresponding coordinate x. For example, the value 0000 of x—0 is 0. Therefore, the difference is 16. This means that 16 comb teeth are arranged at coordinate points determined by x—0 and y—4 through y—16 (the coordinates below 4 is considered to be 4). The value 0001 of x—1 is 8. The difference is therefore 8 which means that 8 comb teeth are arranged at coordinate points determined by x—1 and y—9 through y—6. The subsequent coordinates similarly have their predetermined numbers of comb teeth respectively arranged at different coordinate points.

With the comb-like code plate 1 prepared in the manner as described above, the numbers of pulses can be obtained at approximately uniformalized intervals for different zooming steps.

Figure 5:
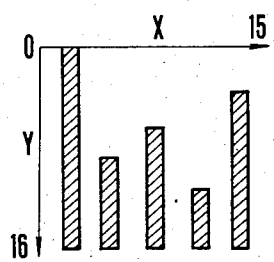
FIG. 5 shows a code plate as a fourth embodiment example in which the table shown in FIG. 4 is applied to an orthogonal coordinates type code plate.
Figure 6:
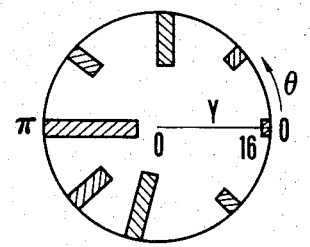
FIG. 6 shows a code plate as a fifth embodiment example in which the table of FIG. 4 is applied to a polar coordinates type code plate.

The above-stated method for the preparation of the code plate is similarly applicable to an orthogonal coordinate arrangement which is shown in FIG. 5 and a polar coordinate arrangement which is shown in FIG. 6 and will provide the same advantageous effect.

Figure 7:
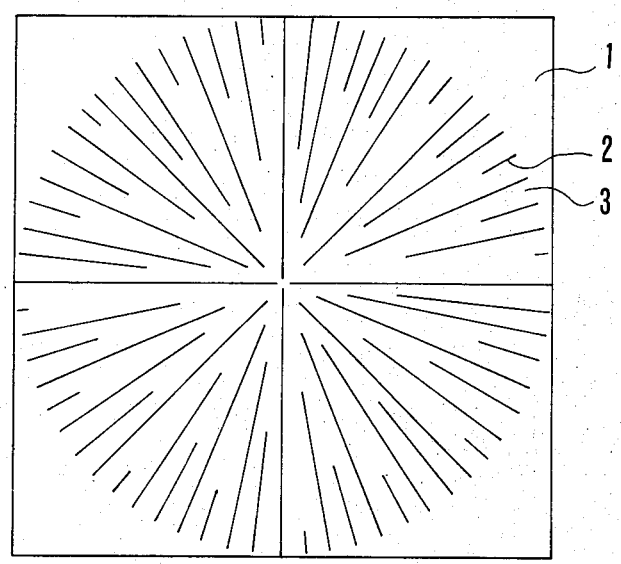
FIG. 7 shows another example of the polar coordinates type code plate according to the invention.

Another example of the polar coordinate code plate 1 according to the present invention is arranged as shown in FIG. 7. In this case, the number of pulses is arranged to increase according as the sliding contact part of the brush comes closer to the periphery of the code plate and thus up to 64 on-and-off signals can be produced from the code plate.

Figure 8:
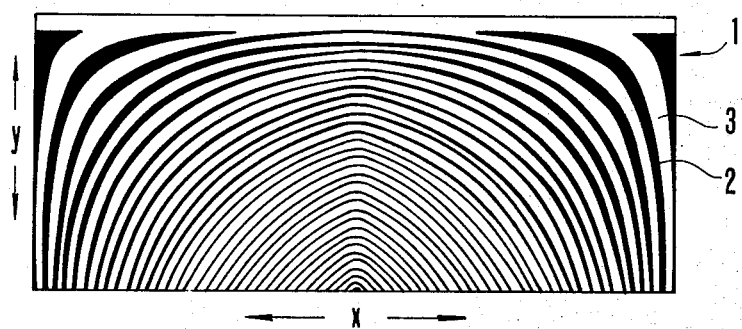
FIG. 8 shows another example of the orthogonal coordinates type code plate of the invention.

FIG. 8 shows another example of the orthogonal coordinate code plate 1 according to the invention. In this example, the number of pulses is arranged, accordingly as the coordinate y comes to a lower location. Up to 64 on-and-off signals also can be produced by the arrangement. In both cases of FIGS. 7 and 8, the increase and decrease in the number of pulses can be accomplished with pulses of approximately uniformalized intervals.

In these embodiment examples, the brush is arranged to be moved by a zooming operation while the code plate 1 is arranged to be moved by a focusing action. However, this arrangement may be reversed. Further, it is also possible to have either one of them stationary while the other is arranged to be movable either by the zooming operation or by the focusing action.

Further, with regard to the signal source elements, the use of the conductive parts 2 and the non-conductive parts 3 may be replaced by light transmissive parts and light blocking parts or N magnetic pole parts and S magnetic pole parts to produce on-and-off signals by means of a photo interrupter or a magnetic sensor. is arranged to be moved by a focusing action.

What we claim:

1. A code plate for a zoom lens, comprising:
   a substrate for the code plate; and
   a plurality of signal sources arranged and formed on said substrate of the code plate in a first direction in which a member moves as the object distance varies which moves according to a change in a distance to an object to be photographed, and, unlike that of the first detection, said signal sources being arranged to have their spacing intervals variable according to displacement of the member in a second direction in which said displacement takes place in association with a change in the focal length of a photo-taking lens and wherein the width of each of said signal sources in the first direction is equal to each of the spacing intervals of said signal sources in said first direction.

2. A code plate for an automatic focusing zoom lens, comprising:
   a substrate for the code plate; and
   a plurality of signal sources formed and arranged on said substrate along a first direction in which their positions of contact with a detector vary according to the displacement of a member taking place in association with focus adjusting extent of a photo-taking lens, said signal sources being arranged such that, in a second direction in which their positions of contact with said detector vary according to the displacement of a member taking place in association with a change in the focal length of the photo-taking lens, the number of the signal sources increasing as the focal length becomes longer and decreasing as the focal length becomes shorter, wherein said signal sources and said substrate of the code plate are composed of light transmissive parts and light blocking parts.

3. A code plate for an automatic focusing zoom lens, comprising:
   a substrate for the code plate; and
   a plurality of signal sources formed and arranged on said substrate along a first detection in which their positions of contact with a detector vary according to the displacement of a member taking place in association with focus adjusting extent of a photo-taking lens, said signal sources being arranged such that, in a second direction in which their positions of contact with said detector vary according to the displacement of a member taking place in association with a change in the focal length of the photo-taking lens, the number of the signal sources increasing as the focal length becomes longer and decreasing as the focal length becomes shorter, wherein said signal sources and said substrate of the code plate are composed of a magnetic substance and a non-magnetic substance.

4. A lens movement detection device for a zoom lens, comprising:
   (a) a substrate; and
   (b) a code pattern arranged on said substrate, said code pattern having a plurality of signal sources so that a corresponding number of pulses to the moved amount of the lens are formed from the signal sources, and the signal sources of said code pattern being arranged so that the number of pulses formed in unity of the moved amount of the lens increases as the focal length of the lens increases.

* * * * *